United States Patent [19]

Stepan

[11] Patent Number: 4,575,165

[45] Date of Patent: Mar. 11, 1986

[54] CIRCUIT TO POST INTERCONNECTION DEVICE

[75] Inventor: William E. Stepan, Clarendon Hills, Ill.

[73] Assignee: GTE Communication Systems Corporation, Phoenix, Ariz.

[21] Appl. No.: 660,348

[22] Filed: Oct. 12, 1984

[51] Int. Cl.⁴ .............................................. H01R 9/09
[52] U.S. Cl. ................................................. 339/17 M
[58] Field of Search .......... 339/17 M, 17 LC, 17 LM, 339/17 C, 17 CF, 17 N, 17 L, 258 R, 258 P; 361/393, 412–414

[56] References Cited

U.S. PATENT DOCUMENTS

| 3,192,498 | 6/1965 | Ruehlemann | 339/258 R |
| 3,270,251 | 8/1966 | Evans | 339/17 LM |
| 3,287,686 | 11/1966 | Ruehlemann | 339/17 LM |
| 3,660,803 | 5/1972 | Cooney | 339/17 LM |
| 3,805,117 | 4/1974 | Hausman | 361/412 |
| 4,025,162 | 5/1977 | Yagi | 339/17 M |

FOREIGN PATENT DOCUMENTS 2930506  3/1981  Fed. Rep. of Germany ... 339/17 LC

Primary Examiner—Neil Abrams
Attorney, Agent, or Firm—Anthony Miologos; Peter Xiarhos

[57] ABSTRACT

A circuit interconnection device for mechanically retaining and electrically connecting a planer substrate such as a thick/thin film circuit to a printed wiring card. The circuit interconnection device is characterized by a generally rectangular device body having planer sidewalls defining a hollow interconnection post receiving area therebetween. A pair of ears extend from a bottom edge of a front wall arranged to have an edge of the substrate rest thereon. A pair of substrate spring members extend outward from a top edge of the front wall to engage the substrate retaining and connecting the substrate to the terminating body. A rear wall includes a pair of post spring members extending inwardly into the post receiving area engaging an interconnection post extending from the printed wiring card thereby retaining and connecting the terminating body to the printed wiring card.

3 Claims, 3 Drawing Figures

CIRCUIT TO POST INTERCONNECTION DEVICE

CROSS-REFERENCE TO RELATED APPLICATIONS

The present application is related to co-pending U.S. patent application Ser. No. 660,346 titled "A Circuit Terminating Device" and U.S. patent application Ser. No 660,347 titled "A Circuit Terminating Clip", both having the same inventive entity and being assigned to the same assignee.

BACKGROUND OF THE INVENTION

This invention relates in general to electrical interconnection devices and more particularly to a device for providing electrical connections between planer circuits such as thick/thin film hybrid circuits and printed wiring cards.

Typically, electrical connections to thick/thin film hybrid circuits are made through wires or terminal devices. These terminal devices are soldered onto a hybrid circuits edge with an opposite end plugged into a socket or more likely, into holes in a printed wiring card (PWC). When inserted into PWC holes, the connections are soldered to insure good mechanical and electrical connections. This method finds disadvantage in that the replacement of defective hybrid circuits is obviously difficult and sometimes damaging to the entire PWC assembly.

Still another method of making such interconnections is the use of sockets on the PWC which accept hybrid terminal devices as a plug in module. This method also finds disadvantage in that it adds significantly to the cost of the assembly. Further, the hybrid terminals are usually not designed as pluggable contacts and can become damaged through careless insertion. Finally, the possibility exists that the socket receptacles on the PWC can become damaged making the entire PWC assembly unusable.

It has become increasingly popular in the industry in recent years to use square or rectangular metallic posts as an interconnection member. Such posts are pressed into holes in a PWC, with the electrical connection between the posts and the PWC made by either intimate contact or with the aid of a solder connection. Various means can be used to interconnect one PWC to another or a PWC to a thick/thin hybrid circuit. These interconnection means can range from the use of receptacles made for this purpose or the use of wire wrapping.

Presently known receptacles require one or more holes in the PWC substrate for attachment. This finds disadvantage however in thick/thin film hybrids since they are usually made out of a ceramic substrate and usually are economically impractical to include holes.

Accordingly, it is the object of the present invention to provide a circuit terminating device for interconnecting planer circuits such as thick/thin film hybrid circuits to a PWC in an effective and economical manner.

SUMMARY OF THE INVENTION

In accomplishing the object of the present invention there is provided a circuit interconnection device for mechanically retaining and electrically connecting a planer substrate to a printed wiring card. The planer substrate includes at least one termination pad located adjacent one edge of said substrate. The printed wiring card includes at least one interconnection post extending perpendicularly from a top surface of the printed wiring card.

The circuit interconnection device of the present invention is characterized by a generally rectangular device body having a pair of planer sidewalls and a planer front and rear wall defining a hollow interconnecting post receiving area therebetween. The rear wall includes a pair of adjacently located post springs members extending inwardly into the post receiving area. The post receiving area is arranged to accept substantially therein the interconnection post. Each post spring member engages and exerts a compressive force against the interconnection post, thereby mechanically retaining and electrically connecting the device body to the interconnection post.

A pair of rectangularly shaped ears spaced parallel to each other extend from a bottom edge of the front wall. The ears define a shoulder areas between a top surface of the ears and the front wall arranged to have an edge of the substrate rest on the shoulder area. A pair of S-shaped substrate spring members spaced parallel to each other extend outward from a top edge of the front wall. Each of the substrate spring members include a contact surface arranged to compressively engage the termination pad on the substrate, mechanically retaining and electrically connecting the substrate to the device body.

DESCRIPTION OF THE PREFERRED EMBODIMENT

Figure 1:
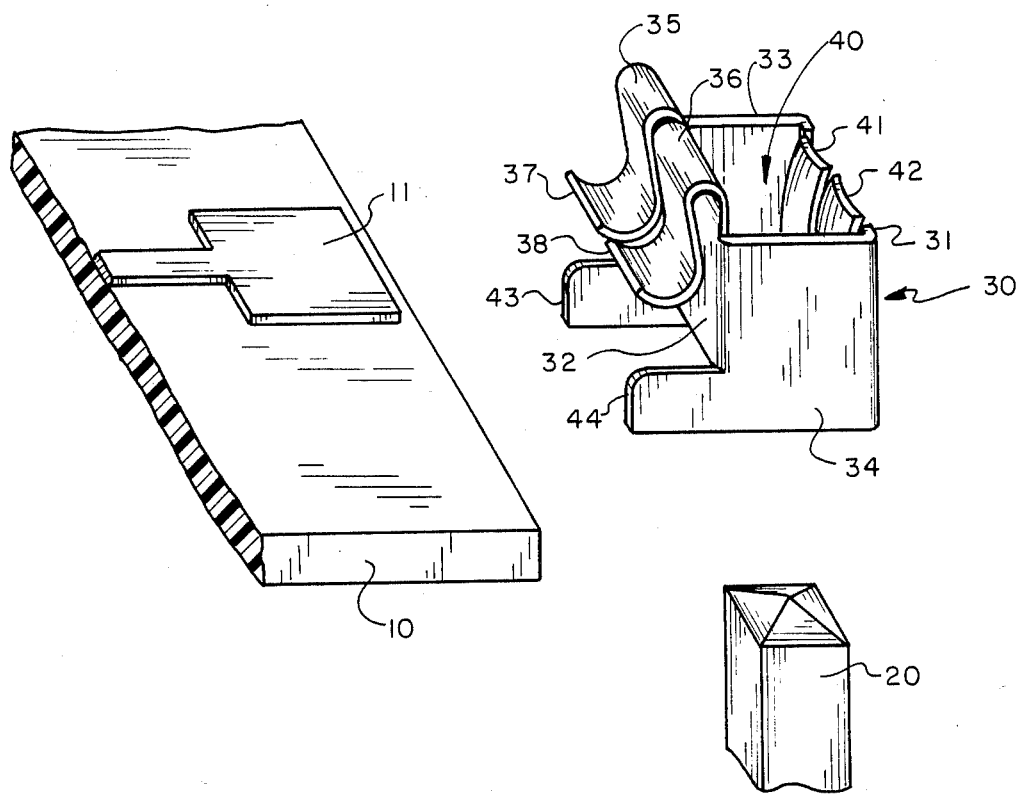
FIG. 1 is a perspective view of the device of the present invention.

Turning now to FIG. 1, the present invention is characterized by a rectangular device body shown generally as 30 and having a vertical back wall 31, front wall 32, and sidewalls 33 and 34. Walls 31–34 define an interconnection post receiving area 40, extending through body 30, arranged to accept a square interconnection post 20 therein. Post spring members 41 and 42 extend inward into receiving area 40 from back wall 31 and exert a compressive force on interconnection post 20, providing a compressive fit of body 30 on post 20.

A pair of S-shaped substrate spring member 35 and 36 extend outward of the top edge of front wall 32. Surface 38 and 37 of substrate spring members 35 and 36 respectively, and ears 43,44 define a substrate accepting area 39 therebetween arranged to accept an edge of a planer substrate 10. A termination pad 11 on substrate 10 has a compressive force applied to it by surfaces 38 and 37 providing an intimate mechanical connection as well as an electrical connection between substrate 10 and device body 30.

Ears 43 and 44 help align body 30 perpendicular to substrate 10 when body 30 is mounted onto the substrate and also aid in transmitting the force of insertion of body 30 onto post 20 to the substrate, thereby reducing the strain on substrate spring members 35 and 36. The device body 30 is fixedly attached to substrate 10 by the application of solder to surfaces 38 and 37 and pad 11.

The circuit terminating device of the present invention is stamped out of and formed from a phosphor bronze material exhibiting good conductive qualities.

Figure 2:
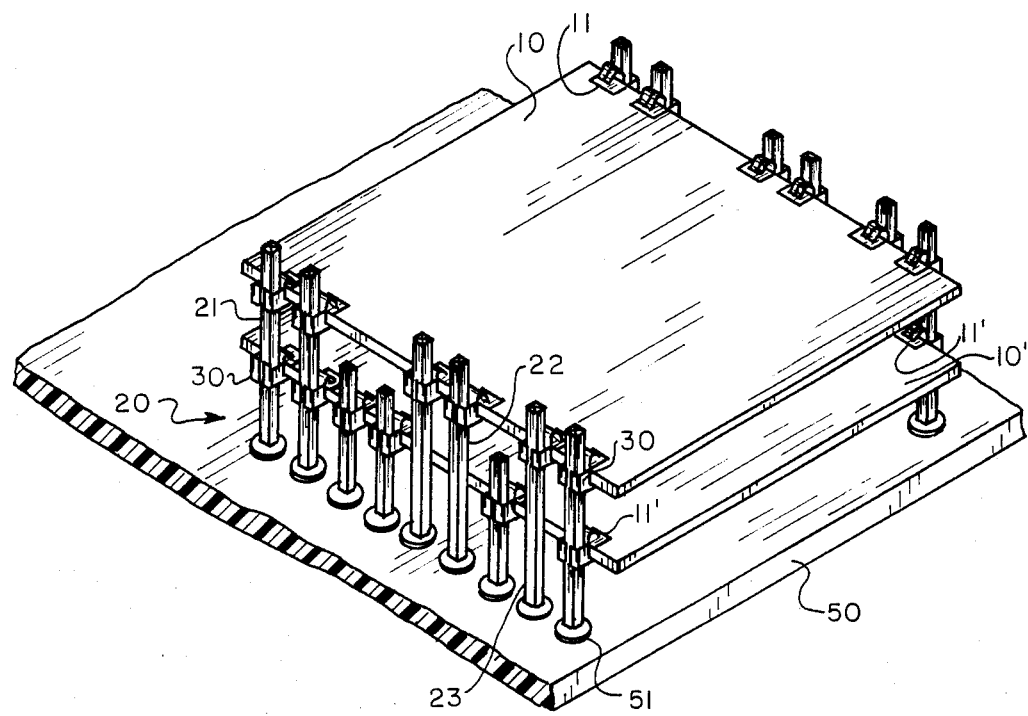
FIG. 2 is a perspective view illustrating the use of the device of the present invention for interconnecting two substrates to a PWC.

Turning now to FIG. 2, an example of the intended use of the device of the present invention is illustrated. As can be seen a printed wiring card (PWC) 50 has a plurality of interconnection posts 20 affixed to the PWC 50 by soldering a plurality of interconnection posts 20 to holes 51. As can be seen in the example, two planer substrates 10 and 10' are mounted to the PWC in a parallel fashion. The planer substrates 10 and 10' can be thick/thin film hybrid circuits or other printed wiring devices. The devices of the present invention as explained earlier are fixed to the termination pads 11 on each substrate 10, 10' and each body 30 attached by mating a respective post 20 into post receiving area 40. The posts can further be grouped into common or signal specific terminals. For example posts 21 provide common signals from the PWC to both substrates 10 and 10'. Specific signals from the PWC to each substrate 10, 10' may be accomplished by post 22 which provides signals from the PWC to substrate 10 or post 23 which provides signals to substrate 10'.

It will be understood by those skilled in the art that any number of substrates may be stacked in a parallel fashion as shown, with the only limitation being the hight of the terminal post.

Figure 3:
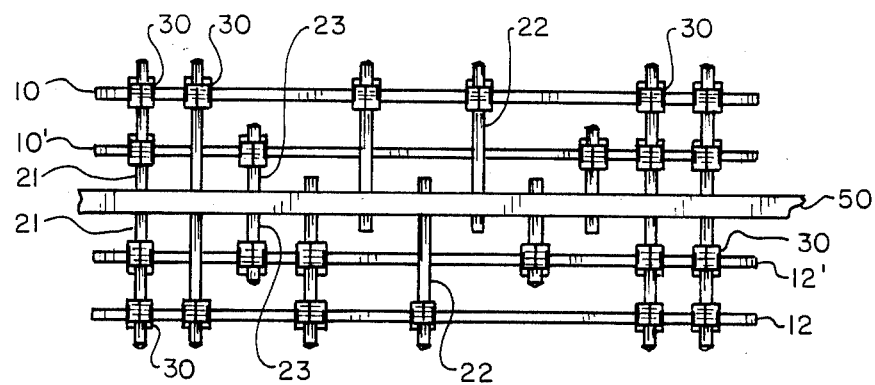
FIG. 3 is an elevational view illustrating the use of device of the present invention for interconnecting a plurality of substrates on both sides of a PWC.

Turning now to FIG. 3 a second example of the way in which the present invention may be used to advantage is illustrated. Basically the second example is similar to the first example shown on FIG. 2 with the exception that the posts also extend from the bottom of PWC 50 and connect to additional substrates 12 and 12'. Substrates 12 and 12' are interconnected via body 30 and post 21 for common connections, post 23 for substrates 12' connections and post 22 for the substrate 12 connections.

It will be appreciated by those skilled in the art that the present invention has advantages in the mounting of thick/thin film hybrid circuits to printed wiring boards over the prior art devices. The advantages include the replacing of defective hybrid circuits and the placing of the hybrids over existing components on a PWC without making those components inaccessible if relacement is necessary.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A circuit interconnection device for mechanically retaining and electrically connecting a planer substrate to a printed wiring card, said planer substrate including at least one termination pad located adjacent one edge of said substrate, and said printed wiring card including at least one interconnection post extending perpendicularly from a top surface of said printed wiring card, said circuit interconnection device comprising:

a generally rectangular device body having a pair of planer sidewalls and a planer front and rear wall defining a hollow interconnection post receiving area therebetween, said rear wall including a pair of adjacently located post spring members extending inwardly into said post receiving area, said post receiving area arranged to accept substantially therein said interconnection post with each post spring member engaging and exerting a compressive force against said interconnection post, mechanically retaining and electrically connecting said device body to said interconnection post;

a pair of rectangularly shaped ears spaced parallel to each other extending from a bottom edge of said front wall, said ears defining a shoulder area between said ears and said front wall arranged to have an edge of said substrate rest on said shoulder area; and, a pair of S-shaped substrate spring members spaced parallel to each other extending from the top edge of said front wall, each of said substrate spring member including a contact surface arranged to compressively engage said termination pad, mechanically retaining and electrically connecting said substrate to said device body.

2. The circuit interconnection device as claimed in claim 1, wherein: said circuit interconnection device is formed as a one-piece unit from an electrically conductive material.

3. The circuit interconnection device as claimed in claim 1, wherein: said device body is fixedly retained to said substract by the application of solder to said termination pad and said substrate spring member contact surfaces.

* * * * *